(12) United States Patent
Kondo et al.

(10) Patent No.: US 6,385,290 B1
(45) Date of Patent: May 7, 2002

(54) X-RAY APPARATUS

(75) Inventors: Hiroyuki Kondo, Tsukuba; Noriaki Kandaka, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/395,163

(22) Filed: Sep. 14, 1999

(30) Foreign Application Priority Data

Sep. 14, 1998 (JP) .......................................... 10-259057
Sep. 14, 1998 (JP) .......................................... 10-259059

(51) Int. Cl.[7] ................................................ G21K 1/06
(52) U.S. Cl. ...................................................... 378/84
(58) Field of Search ........................................... 378/84

(56) References Cited

U.S. PATENT DOCUMENTS 4,980,536 A    12/1990  Asch et al. ............ 219/121.68
5,390,228 A  * 2/1995  Niibe et al. .................. 378/34
5,480,492 A    1/1996  Udagawa et al. .............. 134/2
5,643,472 A    7/1997  Engelsberg et al. ........... 216/65

FOREIGN PATENT DOCUMENTS

JP          11-26409          1/1999

* cited by examiner

Primary Examiner—Robert H. Kim
Assistant Examiner—Jurie Yun
(74) Attorney, Agent, or Firm—Morgan, Lewis & Bockius LLP

(57) ABSTRACT

A x-ray apparatus includes an x-ray source, an x-ray optical system, wherein the x-ray optical system extracts x-rays of a specific wavelength from the x-ray source and converts the x-rays into a beam, and an irradiation source that causes radiation to be incident on surfaces of optical elements contained in the x-ray apparatus.

17 Claims, 6 Drawing Sheets

X-RAY APPARATUS

This application claims the benefit of Japanese patent applications No. 10-259057 and No. 10-259059, filed Sep. 14, 1998, which are hereby incorporated by reference.

BACKGROUND OF THE INVENTION

1. Field of the Invention

The present invention relates to an a x-ray device, and more particularly, to an x-ray apparatus such as an x-ray exposure apparatus, an x-ray microscope, or an x-ray analysis device.

The present invention also relates to an x-ray generating apparatus for use as an x-ray source in an x-ray apparatus such as an x-ray exposure apparatus, an x-ray microscope, or an x-ray analysis device.

2. Description of the Related Art

An apparatus, which uses a reduction and projection type exposure by light technique, is currently widely used for the manufacture of semiconductor integrated circuits that have fine semiconductor integrated circuit patterns. Examples of such an apparatus include an x-ray exposure apparatus, an x-ray microscope, and an x-ray analysis device. This apparatus also includes an x-ray generating apparatus as an x-ray source, and a plurality of optical elements.

The wavelength of the light used in such an apparatus has become progressively shorter as patterns have become finer. As a result, attempts have been made to use soft x-rays for the formation of fine patterns, which are, in principle, impossible to achieve using visible or ultraviolet light. However, in the soft x-ray region that includes wavelengths of 1 to 100 nm, all substances show a strong absorption. Accordingly, transmission type optical elements that utilize refraction in the visible light region are not used. Instead, extremely thin-film filters or reflective mirrors, which have multi-layer films formed on them, are used as optical elements. In particular, multi-layer film mirrors have been manufactured in which a direct-incidence reflectivity of approximately 70% is obtained in the vicinity of wavelengths of 11 nm and 13 nm, and the reduction and projection type exposure apparatus with reflective optical systems using such multi-layer films has been proposed.

In cases where thin-film filters or multi-layer films are used, contaminants adhering to the surfaces of such elements are a serious problem. Furthermore, all substances show a strong absorption in the soft x-ray region. Moreover, if a device contains sliding parts such as sample stages, fine particles are generated, and these particles might adhere to the surfaces of soft x-ray optical elements. Soft x-rays are also absorbed by air, and therefore, the light path must be evacuated to a vacuum state. However, there is a slight back flow of oil from ordinary evacuation systems. Under such conditions, when soft x-ray irradiation is performed, carbon contaminants adhere to the surfaces of soft x-ray optical elements. In addition, in an x-ray exposure apparatus, wafers coated with light sensitive polymer known as resists are conveyed into the vacuum vessel during exposure, and such resists generate small amounts of gases that may also cause carbon contamination. These contaminants cause a drop in soft x-ray transmissivity and reflectivity.

Moreover, the x-ray generating apparatus that is used as the x-ray source in an x-ray apparatus also generates particles that adhere to optical elements of the apparatus. An example of an x-ray source is a laser plasma x-ray source or an LPX. In all LPX, pulsed laser light (one example of an exciting energy beam) is focused and directed onto a target material placed in a vacuum vessel under reduced pressure. The target material is rapidly converted into plasma, and x-rays with an extremely high brightness are emitted from this plasma. In particular, such x-ray apparatus are compact, but have a brightness comparable to that of undulators.

Furthermore, an LPX differs from synchrotron radiation light since a high degree of vacuum, such as approximately $10^{-9}$ torr, is not required. It is only necessary for the degree of vacuum to be high enough to prevent gas discharge due to residual gas before the laser light reaches the surface of the target; or to prevent strong absorption of the x-rays generated from the plasma before these x-rays reach the object of irradiation. In particular, a pressure from several tens of torr to 0.1 torr is sufficient. Accordingly, an inexpensive vacuum evacuation device such as a rotary pump is sufficient, and can easily be used. Thus, such an LPX has attracted attention in recent years for use as an x-ray source in x-ray exposure apparatus, x-ray microscopes, or x-ray analysis devices.

In an LPX, particles such as high-velocity ions and electrons, and particles of materials from the target material such as gasified materials, ionized materials, and material fragments are emitted from the plasma along with the x-rays. These particles scatter throughout the interior of the vacuum vessel. In an x-ray apparatus, which uses an LPX as an x-ray source, such scattered particles adhere to the surfaces of soft x-ray optical elements and cause problems, such as reduction in reflectivity and transmissivity. Accordingly, it is necessary to reduce the quantities of such particles that are generated, and to remove scattered particles that adhere to the optical elements.

Various methods are used to reduce and remove contamination. A wet cleaning method is the most commonly used method to clean the surfaces of contaminated substances. This method consists of treatment by a chemical agent and rinsing by pure water. This cleaning method is very widely used in semiconductor integrated circuit manufacturing processes, and is capable of removing fine adhering substances if the purity of the chemical solution and pure water is increased. However, the wet cleaning method has various problems including consumption of large quantities of cleaning solution and pure water. As a result, in recent years, other cleaning methods, such as the blowing of fine water droplets onto the objects being cleaned at super-high velocities and irradiation with pulsed light, have been proposed.

The latter method of irradiation with pulsed light is effective if a light of a wavelength that can be strongly absorbed by the adhering matter or the substrate is used. When the pulsed light abruptly heats a slight surface portion of the substance, then this surface portion expands. However, when heating occurs in a short time by pulsed light, the displacement acceleration is extremely large, and as a result, the fine particles adhering to the surface can be removed. Furthermore, even in cases where adhering matter is formed in a thin-film configuration on the surface, instantaneous peeling occurs during irradiation with pulsed light. In such cases, the adhering matter is removed, as in the case of fine particles, due to a result of differences in the physical characteristics such as the thermal expansion rate of the underlying material.

Moreover, if the adhering matter is organic matter consisting chiefly of carbon, the removal can be achieved by irradiation with ultraviolet light in an appropriate oxygen atmosphere. In particular, the bonds between carbon atoms in the adhering matter are cleaved by the ultraviolet light. As a result, the carbon bonds with oxygen and is removed in the form of carbon dioxide.

The possibility of some type of substance adhering to the surfaces of soft x-ray optical elements placed in a vacuum cannot be completely eliminated. However, the soft x-ray optical systems are extremely sensitive to surface contamination, and it is necessary to remove substances adhering to such soft x-ray optical elements. However, cleaning in a vacuum using wet cleaning methods, which are currently the most common methods in use, is undesirable because in order to perform cleaning in such cases, it is necessary to remove the soft x-ray optical elements from the vacuum vessel. Moreover, it is necessary to perform a strict alignment when re-installing the soft x-ray optical elements in the vacuum vessel after cleaning. Such a procedure requires considerable time, and is therefore undesirable. As a result, a technique is needed that makes it possible for removing substances adhering to the surfaces of soft x-ray optical elements with the elements left in place without removing the elements from the vacuum vessel.

The problem with an LPX, as described in the foregoing description, will be described now in more detail. As mentioned in the foregoing description, in LPXs, ions, atoms and small fragments of the target material are emitted from the plasma or the vicinity of the plasma in addition to x-rays. Such stray matter may deposit or adhere to optical elements disposed in the vicinity of the plasma. For example, such stray matter may deposit on windows used to introduce the laser light into the vacuum vessel, lenses used to focus the laser light in cases where focusing elements are disposed inside the vacuum vessel, mirrors used to reflect the x-rays radiated from the plasma, and filters used to cut visible light but pass x-rays radiated from the plasma. As a result, this stray matter causes a drop in the reflectivity and transmissivity of the optical elements. Accordingly, removing such stray particles as well as reducing the amounts of such stray matter are important problems in the utilization of LPXs.

Methods have been used to remove and reduce such stray matter. For example, substances that are gases at ordinary temperatures such as nitrogen, carbon dioxide, krypton or xenon are used as the target material. These gases or clusters jet from the nozzle and are irradiated with laser light. Since such target materials are gases at room temperatures, these materials are not deposited on the surfaces of optical elements, and therefore cause no deterioration in the performance of the optical elements. However, this method using these gases also has problems, which will be described next.

In an LPX in which a substance that is a gas at room temperature is used as a target material, the gas that is caused to jet from the nozzle spreads throughout the interior of the vacuum vessel due to free expansion. As a result, the density of the gas decreases abruptly as the distance from the nozzle increases. However, in order to increase the quality of x-rays emitted from the plasma, it is necessary to generate plasma in the vicinity of the nozzle at a distance ranging from several tenths of a millimeter to several millimeters where the gas density is large. Moreover, when plasma is generated in the vicinity of the nozzle, the high-velocity atoms, ions, and electrons emitted from the plasma collide with the nozzle and members located in the vicinity of the nozzle and abrade these elements. As a result, these stray particles, the atoms or small fragments of the nozzle, or members located in the vicinity of the nozzle scatter into the surrounding areas and adhere on the optical elements disposed in the vicinity of the plasma. As a result, the performance of the optical elements drops.

Thus, in cases where a gas or cluster-form target material is used, the plasma must be positioned close to the nozzle to increase the efficiency of energy conversion from laser light to x-rays. However, this causes an increase in the quantity of stray particles scattered from the nozzle and members located in the vicinity of the nozzle. As a result, in LPXs using this gas method, it is difficult to achieve both an improvement in the efficiency of energy conversion from laser light to x-rays and a reduction in the quantity of stray particles.

Furthermore, a slight back-flow of oil may result from the rotary pump into the vacuum system. As a result, this oil deposits on the x-ray optical elements, and causes a gradual drop in the performance of reflectivity, transmissivity, and diffraction efficiency of the x-ray optical elements. In such cases, the only available methods have been methods in which the x-ray generating apparatus is disassembled, and the optical elements are replaced with new elements, or methods in which the optical elements are removed from the apparatus, cleaned and then returned to the apparatus.

SUMMARY OF THE INVENTION

Accordingly, the present invention is directed to an x-ray apparatus, and a x-ray generating apparatus for use as an x-ray source in the x-ray apparatus that substantially obviate one or more of the problems due to limitations and disadvantages of the related art.

An object of the present invention is to provide an x-ray apparatus in which substances adhering to the surfaces of soft x-ray optical elements can be removed without removing the elements from the vacuum vessel.

Another object of the present invention is to provide an LPX in which long-term continuous operation is possible, foreign matter deposited on or adhering to optical elements can be removed, and long-term operation is possible without replacing or cleaning the optical elements even in cases where portions of the nozzle or members located in the vicinity of the nozzle have been abraded away by stray particles such as atoms, ions or electrons emitted from the plasma.

Additional features and advantages of the invention will be set forth in the description which follows, and will be apparent from the description, or may be learned by practice of the invention. The objects and other advantages of the invention will be realized and attained by the structure particularly pointed out in the written description and claims hereof as well as the appended drawings.

To achieve these and other advantages in accordance with the purpose of the invention, as embodied and broadly described herein, an x-ray apparatus includes an x-ray source; an x-ray optical system, wherein the x-ray optical system extracts x-rays of a specific wavelength from the x-ray source and converts the x-rays into a beam; and an irradiation source that causes radiation to be incident on surfaces of optical elements contained in the x-ray apparatus.

In another aspect, the present invention provides an x-ray generating apparatus for use as an x-ray source in an x-ray apparatus that includes a vacuum vessel; a nozzle having a tip end and a body for jetting a gas to be used as a target substance inside the vacuum vessel; a pulsed laser light source for irradiating the target substance, wherein the irradiation causes plasma to be generated from the target substance, and wherein the plasma radiates x-rays; an irradiation source that causes radiation to be incident on surfaces of optical elements contained in the x-ray generating apparatus, wherein the irradiation source is an ultraviolet light source, a vacuum ultraviolet light source, or a light source of a wavelength shorter than the wavelengths of ultraviolet light or vacuum ultraviolet light; and a gas introduction mechanism that introduces either oxygen or ozone, both oxygen and ozone, or a gas containing at least oxygen or ozone into the vacuum vessel or areas surrounding the optical elements that are being irradiated by the irradiation source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
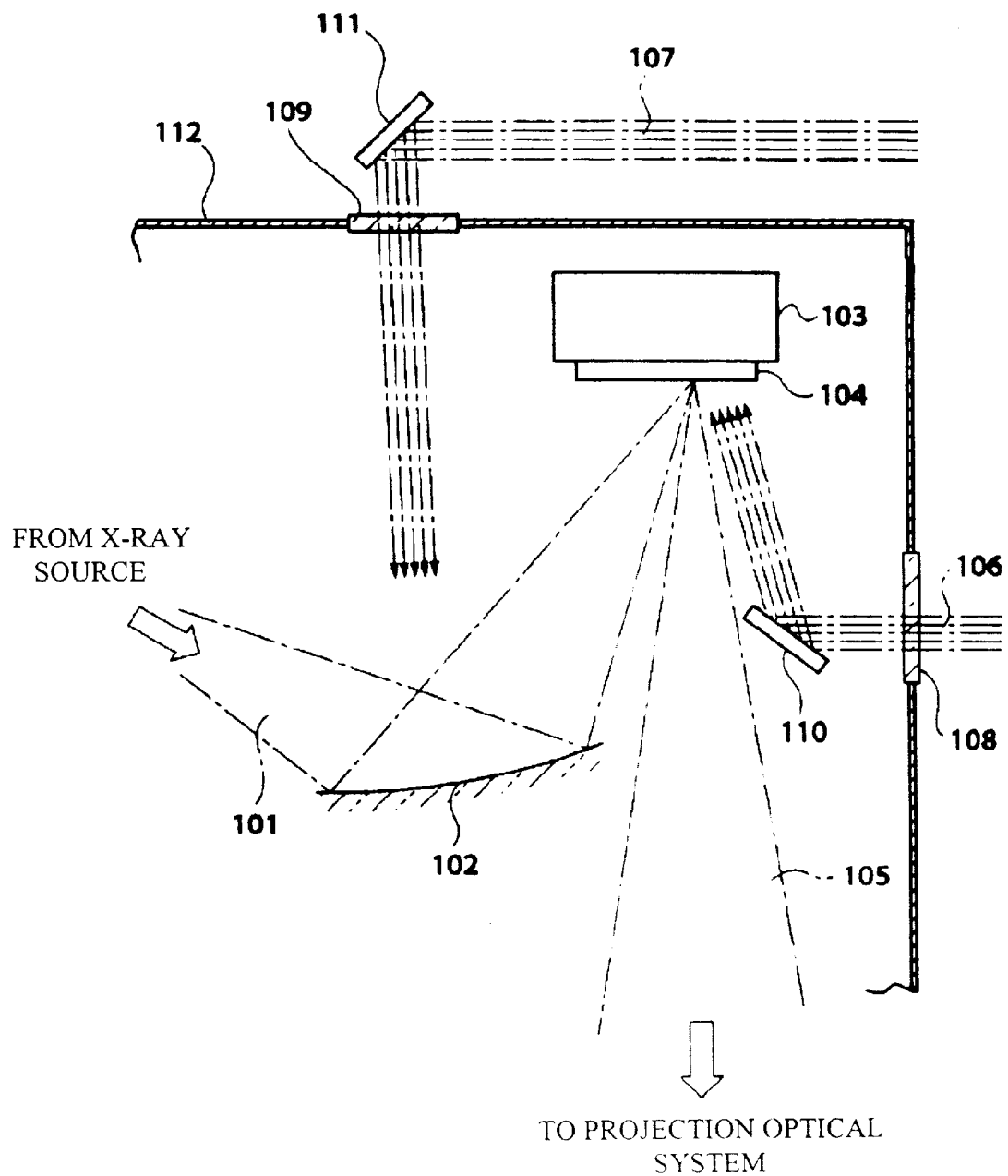
FIG. 1 is a schematic structural diagram illustrating a portion of an x-ray reduction and projection-type exposure apparatus in accordance with an embodiment of the present invention.

Before describing the preferred embodiments of the present invention, various aspects of the present invention will be described.

In the first aspect, the present invention provides an x-ray apparatus, which includes an x-ray generating apparatus; an x-ray optical system, which extracts x-rays of a specific wavelength from the x-rays generated by the x-ray generating apparatus and converts the x-rays into a beam; and a mechanism that causes a pulse-form energy beam to be incident on the surfaces of x-ray optical elements contained in the x-ray apparatus.

In this first aspect of the present invention, when a pulse-form energy beam is incident on the surfaces of x-ray optical elements, fine particles adhering to the surfaces of these x-ray optical elements receive energy from the energy beam. As a result, the temperature rises and causes an abrupt expansion so that motion is excited. Since the incident energy beam is a pulse-form beam, this expansion occurs abruptly and results in an extremely large acceleration of the kinetic displacement. As a result of this motion, fine particles adhering to the surfaces of the x-ray optical elements are removed from the surfaces of these x-ray optical elements.

Moreover, a typical example of such an energy beam is light emitted by an excimer laser. Furthermore, factors, such as the susceptibility of the respective elements to contamination and the extent to which such contamination has an effect on the optical system, determine which x-ray optical elements are to be irradiated with an energy beam. Therefore, it is not always necessary to cause an energy beam to be incident on all of the x-ray optical elements.

In a second aspect, the present invention provides an x-ray apparatus having, in addition to he features of the x-ray apparatus of the first aspect, the pulse width of the pulse-form energy beam be 1 microsecond or less.

By making the pulse width of the energy beam 1 microsecond or shorter, it is possible to increase the kinetic displacement of substances adhering to the surfaces of the x-ray optical elements to the extent that these substances can be securely removed.

In a third aspect, the present invention provides an x-ray apparatus having, in addition to the features of the x-ray apparatus of the first or the second aspect, the energy density per unit area of the pulse-form energy beam be variable.

By making the energy density per unit area of the energy beam variable, it is possible to irradiate the surfaces of the x-ray optical elements with an energy beam of optimal intensity in accordance with the properties of particles adhering to the surfaces of the x-ray optical elements or the properties of thin films formed on the surfaces of these optical elements.

In a fourth aspect, the present invention provides an x-ray apparatus having, in addition to the features of the x-ray apparatus of any of the first through third aspects, the pulse-form energy beam being a variable irradiation position.

As a result of the features provided by the fourth aspect, it is possible to monitor the conditions of contamination of the x-ray optical elements, and to subject portions that are severely contaminated to concentrated irradiation with the energy beam. Accordingly, the contaminants can be efficiently removed. Furthermore, the contaminants can be removed over a broader area by constructing the energy beam so that the intensity is correspondingly increased, and performing a scanning operation by varying the irradiation area.

In a fifth aspect, the present invention provides an x-ray apparatus having, in addition to the features of the x-ray apparatus of any of the first through fourth aspects, the optical elements include reflective mirrors that have multi-layer film structures. Moreover, the multi-layer films are structured such that the number of layers are greater than the number of layers required for sufficient reflectivity with respect to the x-rays used.

The features provided in the fifth aspect provide sufficient reflectivity in the x-ray apparatus even in cases where a slight amount of underlying substance of the optical element is also removed when attempting to remove fine particles adhering to surfaces of the optical elements. For example, if the underlying substrate has a multi-layer film structure for the purpose of obtaining a high x-ray reflectivity, the reflectivity may drop as a result of a decrease in the number of layers. However, due to the structure of the films as provided in the fifth aspect, even if a slight portion of the uppermost layer of the multi-layer film constituting the underlying substrate is removed, the optical element still has a number of layers of maintaining sufficient reflectivity.

In a sixth aspect, the present invention provides an x-ray apparatus having, in addition to the features of the x-ray apparatus of any of the first through fifth aspects, the uppermost layer of the multi-layer film of the reflective mirror be of a substance that has a small x-ray absorption coefficient. Moreover, the thickness of this uppermost layer is greater than that of the one layer forming the periodic structure in the multi-layer film.

In this sixth aspect, even if a slight portion of the uppermost layer of the multi-layer film is removed by irradiation with the pulsed energy beam, the effect on the structure of the multi-layer film is small because the film thickness of the uppermost layer is thicker than that of the one layer forming the periodic structure in the multi-layer film. Accordingly, a high reflectivity can be maintained. Furthermore, since the uppermost portion has a large film thickness and is made of a substance with a relatively small x-ray absorption coefficient, the decrease in x-ray reflectivity can be minimized.

In a seventh aspect, the present invention provides an x-ray apparatus having, in addition to the features of the x-ray apparatus of any of the first through sixth aspects, a mechanism for introducing an inert gas into the vacuum vessel during irradiation by the pulse-form energy beam.

The features provided by the seventh aspect prevent substances, such as fine particles removed by irradiation with the energy beam, from straying throughout the surrounding area and adhering to the surfaces of other x-ray optical elements. In the present aspect, the removed substances are scattered by the inert gas molecules such that these substances lose momentum, and are thus prevented from reaching other x-ray optical elements. As a result, the optical performance of the x-ray optical elements can be maintained.

In an eighth aspect, the present invention provides an x-ray apparatus including, in addition to the features of the x-ray apparatus of any of the first through seventh aspects, a screening device that can cover the surfaces of elements other than the x-ray optical elements being irradiated during irradiation by the pulse-form energy beam.

By using the features provided in the eighth aspect, it is possible to prevent the re-deposition of fine particles on the surfaces of other x-ray optical elements when such fine particles are removed from the surfaces of x-ray optical elements by irradiation with the energy beam. Furthermore, the irradiation of unexpected locations by reflected pulsed light, which might cause damage or deterioration of the affected portions, can also be prevented.

In a ninth aspect, the present invention provides an x-ray apparatus having, in addition to the features of the x-ray apparatus of any of the first through eighth aspects, a mechanism for introducing either oxygen or ozone, both oxygen and ozone, or a gas containing at least one of these gases into the vacuum vessel during irradiation by the pulse-form energy beam.

As a result of the introduction of these gases, carbon excited by the energy beam is bonded with oxygen, and can be easily removed in the form of carbon dioxide. Moreover, this carbon dioxide, together with the introduced gases, is carried out of the x-ray generating apparatus.

In a tenth aspect, the present invention provides an x-ray apparatus having, in addition to the features of the x-ray apparatus of any of the first through ninth aspects, a mechanism that supplies water during irradiation by the pulse-form energy beam to the surfaces of the x-ray optical elements that are being irradiated.

In this tenth aspect, water is supplied to the surfaces by blowing water onto the surfaces or condensing water on the surfaces of the optical elements being irradiated. As a result, the removal of fine articles is more effective due to the thin film of water that is present on the surfaces being irradiated.

In an eleventh aspect, the present invention provides an x-ray apparatus having, in addition to the features of the x-ray apparatus of any of the third through tenth aspects, a continuous ultraviolet light beam instead of a pulse-form energy beam.

In cases where ultraviolet light is used, foreign matter adhering to the surfaces of x-ray optical elements and thin films formed on these surfaces can be removed even if the x-ray optical elements are continuously irradiated instead of being irradiated with a pulse-form beam. Moreover, irradiation with ultraviolet light is especially effective in the removal of carbon contamination.

In a twelfth aspect, the present invention provides an x-ray apparatus, in addition to the features of the x-ray apparatus of the ninth or eleventh aspect, in which the x-ray optical elements are accommodated inside a vessel, which can be sealed or substantially sealed; a mechanism for moving a portion of the vessel, which blocks the light path of the x-rays, to a point outside the light path during x-ray irradiation; a transmitting window, which allows irradiation of the surfaces of the x-ray optical elements with a pulse-form energy beam or ultraviolet light when the vessel is sealed or substantially sealed; and a gas introduction mechanism that introduces either oxygen or ozone gas into the sealed or substantially sealed vessel.

In this twelfth aspect, the length of the light path of the ultraviolet light, which is exposed to oxygen or ozone, is shortened. As a result, attenuation of the ultraviolet light is prevented. For example, in cases where irradiation with ultraviolet light is performed in an oxygen or ozone atmosphere, performing irradiation using lights such as ultraviolet light converts oxygen or ozone into radicals, so that the oxygen is more reactive. Moreover, such irradiation applies energy to the chemical bonds in the stray substances, so that these chemical bonds are cleaved. However, sufficient reaction may not be obtained due to a low density of active oxygen atoms. The low density may result if the oxygen or ozone pressure is lowered too much for the purpose of transmitting ultraviolet light in instances where the light path of the ultraviolet light passing through the oxygen or ozone is long. However, in the present aspect, during irradiation by the pulse-form energy beam or continuous ultraviolet light, the vessel accommodating the x-ray optical elements is sealed, and oxygen or ozone is introduced into the vessel. Then, irradiation is performed via the transmitting window that allows irradiation by a pulse-form energy beam or ultraviolet light. In this case, the light path outside the vessel is evacuated to 0.1 Pa. In the alternative, this light path can also be replaced by dry nitrogen. As a result, the attenuation due to absorption by oxygen inside the vacuum vessel is not a problem, and a pulse-form energy beam or ultraviolet light of a sufficient intensity reaches the surfaces of the x-ray optical elements. Accordingly, a sufficient reaction is provided and carbon contamination can be sufficiently removed.

In a thirteenth aspect, the present invention provides an x-ray apparatus including, in addition to the features of the x-ray apparatus of any of the first through twelfth aspects, a mechanism for heating the x-ray optical elements that are irradiated with the pulse-form energy beam or continuous ultraviolet light beam.

As a result of the heating mechanism provided by this thirteenth aspect, foreign matter adhering to the surfaces of the optical elements can be more easily stripped away. A reaction with the oxygen in such foreign matter or thin films is promoted, specially in cases where oxygen or ozone is present around these x-ray optical element surfaces.

In a fourteenth aspect, the present invention provides an x-ray generating apparatus in which a gas or cluster containing a target substance jets from a nozzle. These parts are disposed inside a vacuum vessel. Then, the target substance is irradiated with a pulsed laser light so that the target substance is converted into plasma, and the x-rays radiated from this plasma are utilized in an x-ray apparatus. Moreover, at least those parts that are abraded away by atoms, ions, or electrons generated from the plasma such as the nozzle and members surrounding the nozzle are constructed from carbon or a substance containing carbon. This type of x-ray generating apparatus is known as a laser plasma x-ray source or LPX.

Moreover, the apparatus is equipped with a mechanism that irradiates at least one of the optical elements disposed inside the vacuum vessel or optical elements forming a part of the vacuum vessel with ultraviolet light, vacuum ultraviolet light, or light of a wavelength shorter than the wavelengths of the ultraviolet or vacuum ultraviolet. The apparatus also has a mechanism that introduces at least one type of gas, which can consist of oxygen, a gas containing oxygen, ozone, or a gas containing ozone, into the vacuum vessel as a whole, or into the area surrounding the optical element that is being irradiated with the light.

In this fourteenth aspect, the carbon in the stray substances reacts with oxygen or ozone, thus forming carbon monoxide (CO) or carbon dioxide ($CO_2$). As a result, the stray substances are removed. Performing irradiation using light, such as ultraviolet light, converts oxygen into radicals, so that the oxygen is more reactive. Such irradiation applies energy to the chemical bonds in the stray substances, so that these chemical bonds are cleaved. Accordingly, such a method is especially effective in cases where the stray substances containing organic compounds, or in cases where oil, for example, is introduced by back-flow from the vacuum pump, adheres to the optical elements. In such cases, the carbon and hydrogen whose chemical bonds have been cleaved react with the radicalized oxygen or ozones, thus forming carbon monoxide (CO), carbon dioxide ($CO_2$), and water ($H_2O$), which are removed from the optical elements. As a result, continuous operation of the LPX over a long period of time becomes possible. Furthermore, recovery of the x-ray intensity can be accomplished in a short time without disassembling the apparatus, replacing or cleaning the optical system, by temporarily stopping the LPX and performing the irradiation described in the foregoing description.

In a fifteenth aspect, the present invention provides an x-ray generating apparatus in which a gas or cluster containing a target substance jets from a nozzle disposed inside a vacuum vessel. Then, the target substance is irradiated with a pulsed laser light so that the target substance is converted into plasma, and the x-rays radiated from this plasma are utilized in an x-ray apparatus. Moreover, at least those parts that are abraded away by atoms, ions, or electrons generated from the plasma such as the nozzle and members surrounding the nozzle are constructed form carbon or a substance containing carbon. This type of x-ray generating apparatus is known as a laser plasma x-ray source or LPX.

Moreover, the apparatus is equipped with a mechanism that irradiates the optical element on which the x-rays radiated from the plasma are initially incident. The mechanism irradiates with ultraviolet light, vacuum ultraviolet light, or light of a wavelength shorter than the wavelengths of the ultraviolet or vacuum ultraviolet. The apparatus also has a mechanism that introduces at least one type of gas, which can consist of oxygen, a gas containing oxygen, ozone, or a gas containing ozone, into the vacuum vessel as a whole, or into the area surrounding the optical element being irradiated with the light.

As a result of the features of the fifteenth aspect, the stray particles, which deposit on the optical element, are broken down and removed for the reasons mentioned in the fourteenth aspect in the foregoing description. Accordingly, a decrease in the x-ray intensity can be efficiently prevented, and the LPX can be continuously operated over a long period of time. Furthermore, by temporarily stopping the LPX and performing the gas introduction and ultraviolet light irradiation, it is possible to recover the x-ray intensity in a short time without disassembling the apparatus, replacing, or cleaning the optical system.

In a sixteenth aspect, the present invention provides an x-ray generating apparatus having, in addition to the features of the x-ray generating apparatus of the fourteenth or the fifteenth aspects, other features such as having the construction of the at least those parts that are abraded away by atoms, ions or electrons generated from the plasma, be diamond or an organic compound with high hardness. Examples of such parts are the nozzle and members surrounding this nozzle.

In this sixteenth aspect, a slower rate of abrasion by atoms, ions, or electrons emitted from the plasma will result if the nozzle or members surrounding the nozzles are constructed from a compound with a high hardness. Accordingly, it is preferable to use the hardest possible materials as the materials of these elements. For example, diamond consists entirely of carbon, and is one of the hardest known substances. Therefore, the quantity of stray particles emitted from the nozzle or members surrounding the nozzle is extremely small if diamond is used. Furthermore, even if stray particles should be deposited on the optical elements, carbon deposited on or adhering to the optical elements can easily be removed, as described in the fifteenth aspect. However, since diamond is extremely expensive, it is impractical to construct the nozzle and members surrounding the nozzle entirely from diamond. As a result, a method in which diamond is used only for the tip end portion of the nozzle, and fine diamond particles are used for coating the area surrounding the nozzle is more practical.

Furthermore, an extremely high hardness may also be obtained with organic compounds such as Kevlar, a type of aromatic compound. Such compounds react with a gas, such as oxygen, by irradiation with a light, such as ultraviolet light. Such compounds are broken down and react as described in the fifteenth aspect. Accordingly, such materials can also be used as the material of the nozzle and members surrounding the nozzle.

In a seventeenth aspect, the present invention provides an x-ray generating apparatus including, in addition to the features of the x-ray generating apparatus of the fourteenth or fifteenth aspects, other features such as having the construction of at least one of the optical elements as a multilayer film mirror. The optical elements include the optical element on which x-rays radiated form the plasma are initially incident. Moreover, in this aspect, the nozzle and members surrounding the nozzle, which may abrade away by atoms, ions, or electrons generated from the plasma, are constructed from a compound or a mixture of carbon and a substance that is also in the multi-layer film. Moreover, the selected substance has a high transmissivity with respect to x-rays of the wavelength that are in use.

In this seventeenth aspect, the stray substances are compounds or mixtures of carbon having a high transmissivity. Among these substances, carbon reacts with oxygen, for example, and is removed as described in the fourteenth aspect. Even if substances other than carbon remain, these substances are substances that are used in the multi-layer film and have a high transmissivity with respect to the x-rays of the wavelength that are in use. Accordingly, the attenuation of the x-rays caused by these substances is slight. Thus, the LPX can be continuously operated over a long period of time. Furthermore, by temporarily stopping the LPX and performing the gas introduction and ultraviolet light irradiation, it is possible to recover the x-ray intensity in a short time without disassembling the apparatus, replacing, or cleaning the optical system.

In an eighteenth aspect, the present invention provides an x-ray generating apparatus having, in addition to the features of the x-ray generating apparatus of any of the fourteenth through seventeenth aspects, a mechanism for heating the optical element that is irradiated by the ultraviolet light, vacuum ultraviolet light, or light of a wavelength shorter than the wavelengths of the ultraviolet or the vacuum ultraviolet light.

As a result of the features of the eighteenth aspect, the reaction of carbon with a gas, such as oxygen, can be accelerated by heating the optical elements that are irradiated with light such as an ultraviolet light.

Reference will now be made in detail to the preferred embodiments of the present invention, examples of which are illustrated in the accompanying drawings. Wherever possible, the same reference numbers will be used throughout the drawings to refer to the same or like parts.

FIG. 1 is a schematic structural diagram illustrating a portion of an x-ray reduction and projection-type exposure apparatus in accordance with a first embodiment of the present invention. This apparatus includes x-ray 101 generated from an x-ray source, a multi-layer film reflective mirror 102, a mask stage 103, a mask 104, x-rays 105, KrF excimer laser lights 106 and 107, windows 108 and 109, reflective mirrors 110 and 111, and a vacuum vessel 112. The operation of this apparatus will be described next by referring to FIG. 1.

X-rays 101 emitted from an x-ray source, which is not shown in FIG. 1, are directed via the multi-layer film reflective mirror 102 constituting an illumination optical system onto the mask 104, which is placed on the mask stage 103. The x-rays 105 reflected by the mask 104 are directed into a projection optical system, which is not shown in FIG. 1. The projection optical system reduces and projects the pattern on the mask. These optical systems are installed inside a vacuum vessel 112 that can be evacuated to a pressure of 1 Pa or less.

As mentioned in the foregoing description, the optical elements in this apparatus get contaminated. In particular, when the multi-layer film reflective mirror 102 and mask 104 are inside the vacuum vessel 112 for a long period of time, carbon contaminants adhere to the surfaces of the elements. The carbon contaminants can result from a slight back-flow of oil from the exhaust system. As a result, the carbon contaminants reduce the x-ray reflectivity of the mirror 102 and mask 104. After a fixed period of time, the surfaces of the multi-layer film reflective mirror 102 and mask 104 are irradiated with KrF excimer laser lights 106 and 107 in order to remove the contaminants.

The irradiation process will be described now in more detail. The apparatus, as shown in FIG. 1, is arranged so that the surfaces of the multi-layer film reflective mirror 102 and mask 104 can be irradiated with KrF excimer laser lights 106 and 107 from outside the vacuum vessel via the windows 108 and 109. The intensity of this irradiation is variable, and the respective positions of irradiation can also be varied by moving the reflective mirrors 110 and 111. Moreover, the apparatus is arranged so that oxygen gas at a pressure of 100 Pa or less can be introduced into the vacuum vessel 112. During irradiation by KrF excimer laser lights 106 and 107, oxygen at a pressure of approximately 100 Pa is introduced into the vacuum vessel 112. When the KrF excimer laser lights 106 and 107 are incident on the mask 104 and reflective mirror 102 with oxygen present in the surrounding areas, the carbon making up the carbon contaminants bonds with oxygen, and results in formation of carbon dioxide. As a result, the carbon contaminants are removed.

Furthermore, if foreign matter consisting of fine particles adheres to the surface of the mask 104, shadow of this foreign matter will be projected and deficiencies will be generated in the exposure. When irradiation with a pulse-form energy beam is performed on such surfaces with these particles, the independent minute particles of foreign matter tend to show a rise in temperature more readily than the mask 104, which spreads in three dimensions. As a result, the foreign matter expands abruptly so that vibration is excited. Moreover, if the pulse duration time is short, this expansion occurs very abruptly resulting in an extremely large displacement acceleration and thus, the fine particles are removed.

Figure 2:
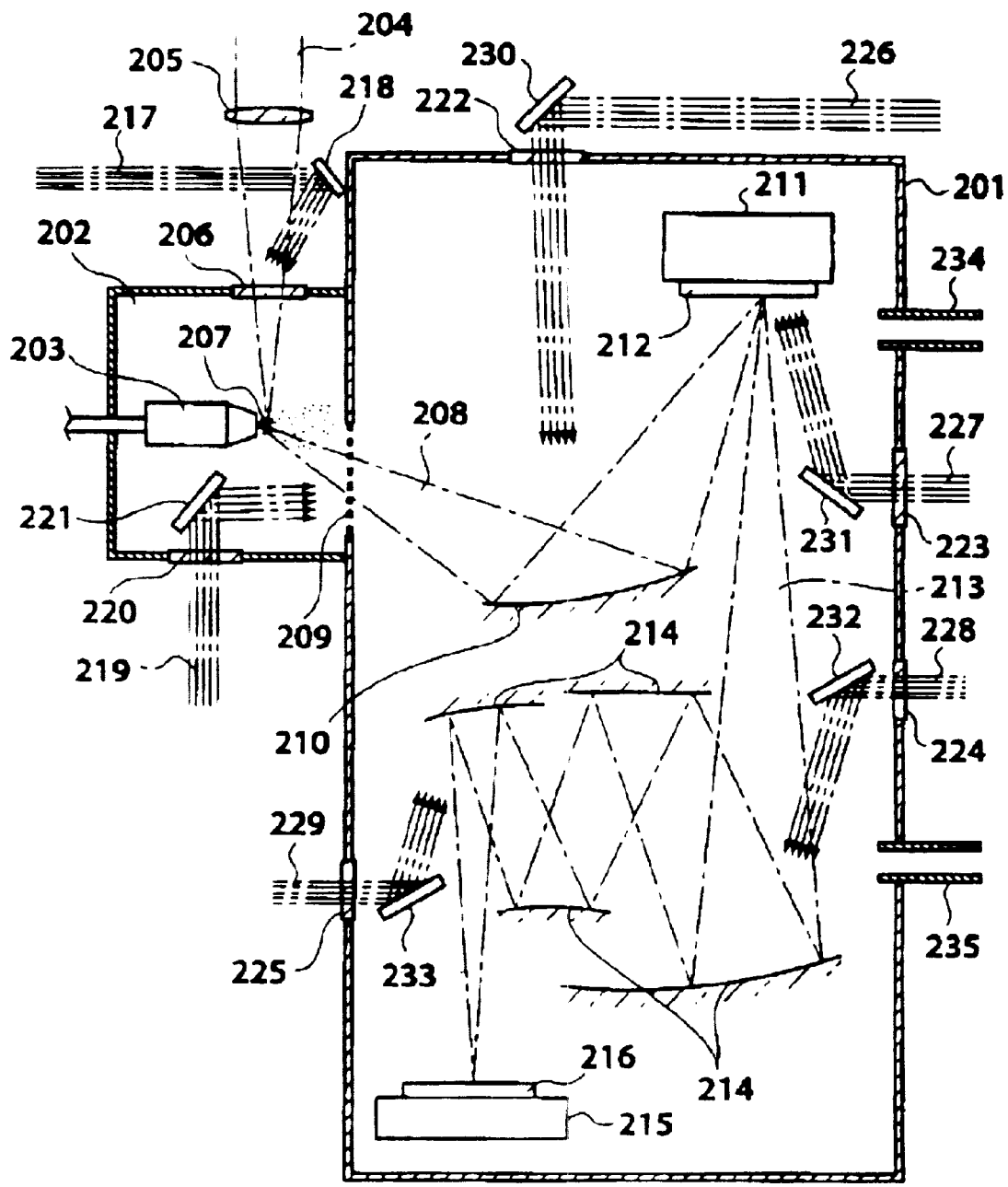
FIG. 2 is a schematic structural diagram illustrating an x-ray reduction and projection-type exposure apparatus in accordance with a second embodiment of the present invention.
Figure 3:
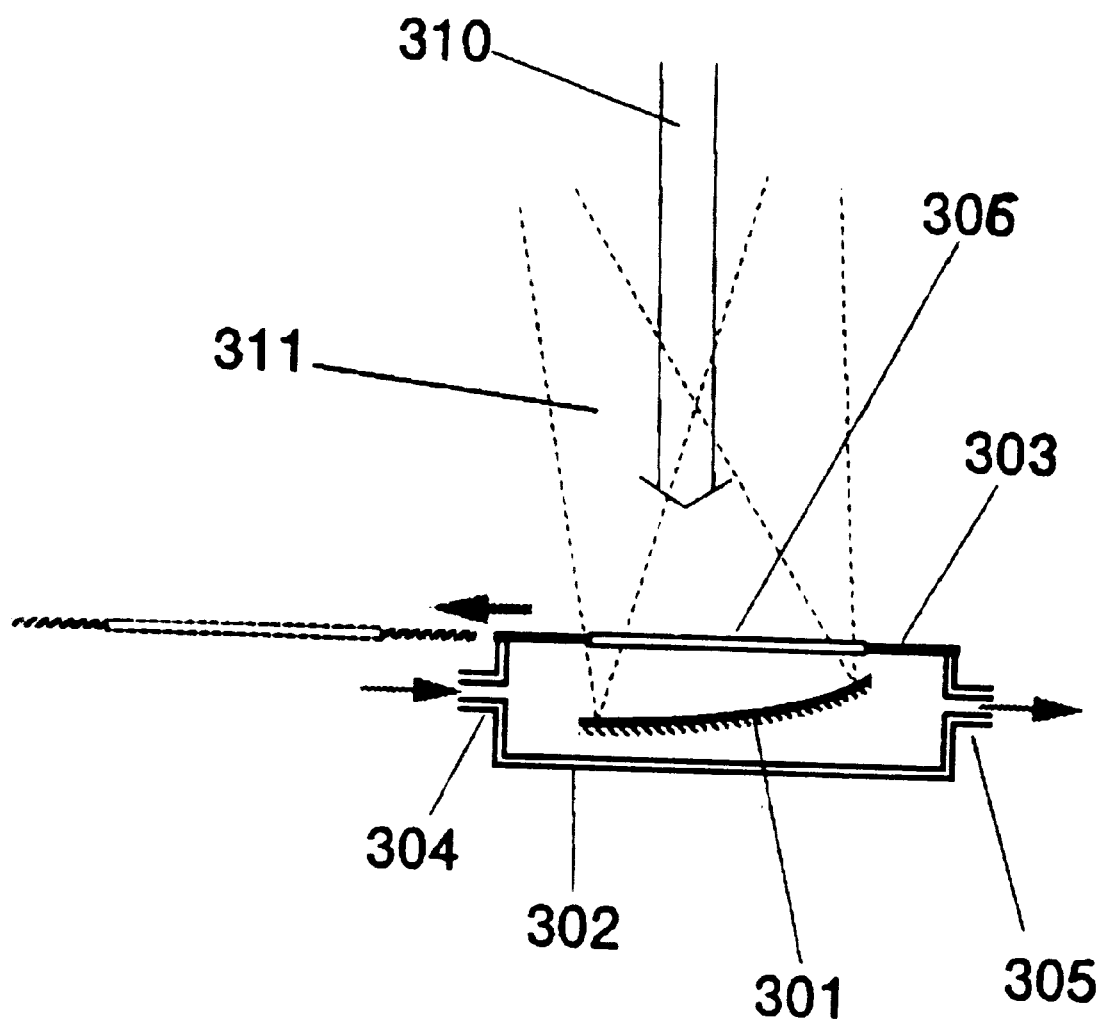
FIG. 3 is a schematic structural diagram illustrating a portion of an x-ray reduction and projection-type exposure apparatus in accordance with a third embodiment of the present invention.

FIG. 3 is a schematic structural diagram illustrating an x-ray reduction and projection-type exposure apparatus in accordance with a second embodiment of the present invention. This apparatus includes a vacuum vessel 201, an x-ray generating part 202, a nozzle 203, a pulsed laser light 204, a lens 205, a pulsed laser light introduction window 206, plasma 207, x-rays 208 generated by the x-ray generating part 202, a thin-film filter 209, a multi-layer film reflective mirror 210 constituting an illumination optical system, a mask stage 211, a mask 212, reflected x-rays 213, multi-layer film reflective mirrors 214 constituting a projection optical system, a wafer stage 215, a silicon wafer 216, a gas introduction port 234, an exhaust port 235, pulsed laser lights 217, 219, 226, 227, 228, and 229, reflective mirrors 218, 221, 230, 231, 232, and 233, and introduction windows 220, 222, 223, 224 and 225. The operation of this apparatus will be described next by referring to FIG. 2.

In the x-ray generating part 202, krypton gas intermediately jets from the nozzle 203. Pulsed laser light 204 of approximately 0.5 J and 10 ns is focused by the lens 205 and causes irradiation of the jetting krypton gas via the pulsed laser light introduction window 206. Plasma 207 is formed at the focal position for generation of soft x-rays. As a result, soft x-rays 208 are generated. These soft x-rays 208 pass through the thin-film filter 209, which is used for x-ray extraction, and enter the x-ray optical system part.

The interior of the vacuum vessel 201 is evacuated by an exhaust apparatus, which is not shown in FIG. 2, for maintaining the pressure at 1 Pa or less to prevent the absorption of the soft x-rays. Moreover, it is preferable that a high degree of vacuum be maintained in the x-ray optical system part in order to avoid the effects of element contamination. However, it is difficult to evacuate the x-ray generating part 202 to a high degree of vacuum due to the krypton gas being released from the nozzle 203. Consequently, the x-ray generating part 202 and x-ray optical system part are partitioned by the thin-film filter 209, which constitutes an x-ray extraction window. The soft x-rays 208 entering the x-ray optical system part are reflected by the multi-layer film reflective mirror 210 and irradiate the mask 212, which is positioned on the mask stage 211.

A pattern is formed on the mask 212 by a x-ray absorber on a multi-layer film. This pattern on the mask 212, which is carried by the reflected x-rays 213, is reduced and projected onto the silicon wafer 216 by the multi-layer reflective mirror 214. The silicon wafer 216 is placed on the wafer stage 215 and is coated with a resist.

The soft x-ray reduction and projection type exposure apparatus, as shown in FIG. 2, contains numerous parts whose performance may drop as a result of surface contamination. For example, in the x-ray generating part 202, contaminants adhere to the sides of the pulsed laser light introduction window 206 and thin-film filter 209 that face the prism 207.

Moreover, as mentioned in the foregoing description, if a gas is used as the target material, the ions that form the plasma 207 constitute a gas, and adhesion is not a problem. However, since the plasma 207 is formed very close to the exit opening of the nozzle 203, the substance forming the exit opening may be abraded away by the plasma. The abrasion results in scattering of this substrate through the surrounding area and adhesion of the substance to other elements. If such contaminants adhere to the pulsed laser light introduction window 206, there will be a decrease in transmissivity and the quantity of x-rays generated also decreases due to a decrease in the focused energy. Furthermore, it such contaminants adhere to the thin-film filter 209, this will decrease the x-ray transmissivity. In order to remove such particles, irradiation with KrF excimer laser light is performed.

The irradiation process will be described now in more detail. The pulsed laser light introduction window 206 is irradiated with KrF excimer laser light 217 from the outside because with transparent material a greater removal effect tends to be obtained when irradiation is performed from the back surface rather than the front that contains the contaminants. Moreover, the irradiation intensity is variable, and contaminants can be removed from the entire surface of the introduction window 206 by moving the reflective mirror 218. For example, irradiation can be performed at an intensity of approximately 100 mJ/cm$^2$.

Since the thin-film filter 209 is not transparent, irradiation is performed from the side of the filter with the contaminants. Specifically, the KrF excimer laser light 219 enters the x-ray generating part 202 via the introduction window 220. Then, the entire surface of the thin-film filter 209 is irradiated by moving the reflective mirror 221. As a result, the adhering matter is removed.

In the case of the multi-layer film reflective mirror 210, mask 212, and multi-layer film reflective mirrors 214, contaminants generated by the x-ray generating part may not adhere directly to the surfaces of these elements. However, there may be some adhesion of carbon contaminants caused by a slight back-flow of oil from the exhaust system inside the vacuum vessel 201, and by the resist applied to the surface of the wafer 212. Furthermore, there is a possibility that fine particles generated by sliding parts, such as the mask stage 211 and wafer stage 215, may also adhere to the reflective mirror and the mask. As a result, KrF excimer laser lights 226, 227, 228, and 229 are introduced via the respective introduction windows 222, 223, 224, and 225, and are directed onto the respective surface using the reflective mirrors 230, 231, 232, and 233. Moreover, during irradiation, oxygen is introduced via the gas introduction port 234, and the exhaust rate from the exhaust port 236 is controlled such that the oxygen pressure is maintained at approximately 100 Pa. When irradiating with KrF excimer laser light with such atmosphere, the carbon atom, whose bonds have been cleaved by the pulsed ultraviolet light, bond with oxygen radicals or ozone. As a result, the carbon is removed in the form of carbon dioxide. Other fine particles adhering to the surfaces are also removed by the abrupt heating and expansion caused by irradiation with the pulsed light.

The preferred embodiments described are not limited to the foregoing description. For example, in the present embodiment, the target material is not limited to krypton gas.

Moreover, the particles removed during irradiation may adhere to the other optical elements in the apparatus. Thus, it is also possible than screening plates, which screen other elements during the irradiation, be installed in order to prevent re-deposition of the removed fine particles on the surfaces of these other elements. Furthermore, it is also possible to install reflected-light screening members to prevent irradiation of unexpected locations as a result of the reflection of the pulsed light used in irradiation.

In the present embodiments, elements directly associated with the soft x-ray reduction and projection type exposure apparatus are irradiated with pulsed light. However, it is possible that the apparatus can be arranged for irradiation of other parts, which might be contaminated. For example, it is also possible to irradiate the window member of an x-ray detector.

Additionally, it is possible to supply water by blowing water onto the surfaces, or by condensing water on the surfaces as long as the water does not have any effect on the performance of the apparatus. The fine particles can be removed more effectively if water is present on the surfaces of the optical elements.

Furthermore, in the present embodiments, pulsed-light irradiation is performed periodically at certain fixed time intervals. However, it would also be possible to perform pulsed-light irradiation if it is detected that there has been a drop in the reflected or transmitted light, and that this drop exceeds a certain fixed amount.

Moreover, the present embodiments are not limited to irradiation with KrF excimer laser light. In particular, it would also be possible to use UV lamp irradiation in cases where carbon contaminants are to be removed. However, in such cases, it is necessary to take absorption by oxygen into consideration and to control the pressure of the oxygen in order for the UV light to reach the contaminated surfaces. In addition, if UV light is used, continuous irradiation is also effective instead of pulsed light. Furthermore, either ultraviolet light emitted from a laser plasma or vacuum ultraviolet light may be used as in ultraviolet light source. In addition to x-rays, lights with a broad wavelength range including visible light, ultraviolet light, and vacuum ultraviolet light are emitted from a laser plasma. Accordingly, if such a laser plasma is used, there is no need for a separate ultraviolet light source.

Another embodiment of the present invention will be described next by referring to FIG. 3. FIG. 3 is a schematic structural diagram illustrating a portion of an x-ray reduction and projection-type exposure apparatus in accordance with a third embodiment of the present invention. This apparatus includes a soft x-ray optical element 301, a soft x-ray optical element accommodating vessel 302, a screening plate 303, a gas introduction port 304, a gas exhaust port 305, a transmitting window 306, ultraviolet light 310, and soft x-rays 311. The operation of this apparatus will be described next.

During the emission of soft x-rays 311, the screening plate 303 is moved to the left, as indicated by the dotted line in FIG. 3, for the irradiation of the soft x-ray optical element 301 by these soft x-rays. When stray particles adhering to the soft x-ray optical element 301 are to be removed, the screening plate 303 is moved to the right, so that the soft x-ray optical element accommodating vessel 302 is sealed. Then, oxygen or ozone gas is introduced into the soft x-ray optical element accommodating vessel 302 via the gas introduction port 304, and is discharged via the gas exhaust port 305. At the same time, the surface of the soft x-ray optical element 301 is irradiated with ultraviolet light 310 via the transmitting window 306. The transmitting window 306 transmits the ultraviolet light, and where the adhering matter is organic matter, the ultraviolet light 310 cleaves the chain-form bonds of the organic matter. So, the carbon atoms whose bonds have thus been cleaved are combined with oxygen radicals or ozone. As a result, the carbon is removed from the surface of the optical element in the form of a gas, such as carbon dioxide.

In the present embodiment, oxygen or ozone gas is introduced into the soft x-ray optical element accommodating vessel 302. Therefore, a high concentration of oxygen or ozone is not present inside the remaining portions of the vacuum vessel. Consequently, the light path of the ultraviolet light 310 passing through the oxygen or ozone is shortened, and the ultraviolet light 310 reaches the vicinity of the soft x-ray optical element 301 without being overly attenuated.

In all the embodiments described in the foregoing description, if the x-ray optical element, which is to be irradiated with pulsed laser light, is heated before irradiation, it is easier to strip adhering fine particles or thin films formed on the surface of the element due to the heating. Furthermore, the bonding of carbon and oxygen is also promoted. Accordingly, such heating is also possible, and preferable.

The next three embodiments will describe an x-ray generating apparatus to be used as an x-ray source in an x-ray apparatus such as the one described in the foregoing description.

Figure 4:
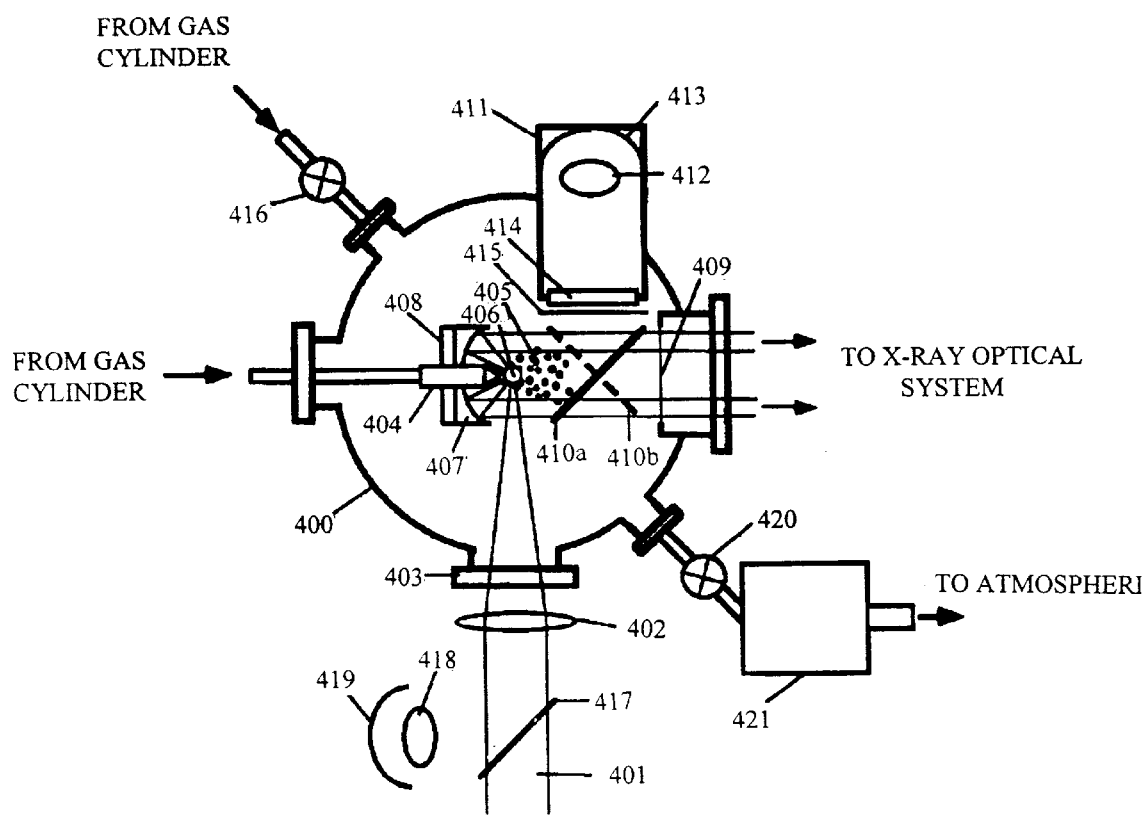
FIG. 4 is a schematic diagram illustrating an LPX system for use as an x-ray source in an x-ray apparatus in accordance with a fourth embodiment of the present invention.

FIG. 4 is a schematic diagram illustrating an LPX system for use as an x-ray source in an x-ray apparatus in accordance with a fourth embodiment of the present invention. This LPX system includes a vacuum vessel 400, a laser light 401, a focusing lens 402, a laser light introduction window 403, a nozzle 404, cluster (gas) molecules 405, plasma 406, a multi-layer film parabolic mirror 407, a beater 408, an x-ray-transmitting visible-light-cutting filter 409, an ultraviolet lamp chamber 411, a window 414, a shutter 415, a vacuum evacuation apparatus 421, a mirror 410a that can also be moved to a position indicated by the dotted line 410b, mirrors 413, 417, and 419, valves 416 and 420, and excimer lamps 412 and 418. The x-ray transmitting visible-light-cutting filter 409 is also known as an x-ray filter. The basic operation of this LPX system will be described next.

Krypton (Kr) gas, which constitutes the target material, is introduced into the vacuum vessel 400 via a feed-through. In particular, the nozzle 104 jets the Kr gas into the interior of the vacuum vessel 400. The nozzle 404 is a pulse jet nozzle, and the duration for which this nozzle is opened is approximately 400 $\mu$sec. Moreover, the Kr gas jets into the vacuum for the nozzle 404 at a back pressure of 50 atmospheres, and undergoes an abrupt temperature drop as a result of adiabatic free expansion. The atoms stick to each other as a result of the van der Walls force, and form cluster molecules 405 with numbers of atoms ranging from several tens of atoms to several thousands of atoms.

Next, the laser light 401 generated by a laser device, which is not shown in FIG. 4, is focused inside the vacuum vessel 400 by the lens 402 via the laser light introduction window 403. The laser light 401 is focused and directed onto the grouped cluster molecules 405 after hundreds of micro seconds have elapsed following the opening of the nozzle 404 and the jetting of the Kr gas into the vacuum. As a result, plasma 406 is generated. Then, this plasma radiate the x-ray. In this case, the mirror 417 is not installed in the position shown in FIG. 4. The function of this mirror will be described later.

Next, the x-rays generated are reflected by the multi-layer film parabolic mirror 407. The x-rays reflected by the mirror 407 form a more or less parallel beam, and are conducted into the x-ray optical system after passing through the x-ray filter 401. The x-ray filter 409 uses a molybdenum (Mo) film with a thickness of 0.3 $\mu$m, which is formed on the surface of a silicon (Si) thin film with a thickness of 0.5 $\mu$m. The structure and operation of some of the elements of this LPX will be described next in detail.

To increase the quantity of x-rays, the focusing and irradiation position of the laser beam, which is the position of plasma generation, should be located as close as possible to the nozzle 404 because the number and density of the cluster molecules 405 drop abruptly with increasing distance from the nozzle 404. Accordingly, in the present embodiment, the distance between the plasma generation position and the tip end of the nozzle 404 is approximately 1 mm.

Moreover, the tip end portion of the nozzle 404 is made of diamond, and the surface of the main body portion of the nozzle 404, which forms a continuation of this tip end portion, is coated with diamond. However, the present invention is not limited to this material. A compound or mixture of carbon with a substance having a high transmissivity with respect to the x-rays of specific wavelengths may also be employed. Additionally, the nozzle 404 is attached such that it passes through the central portion of the multi-layer film parabolic mirror 407. Furthermore, the position of the nozzle 404 and the focal position of the laser light are set such that the plasma is generated at the focal position of the multi-layer film parabolic mirror 407.

The multi-layer film of the multi-layer film parabolic mirror 407 consists of molybdenum (Mo) and silicon (Si). The periodic length, which is also known as the thickness, of the multi-layer film is set such that the center wavelength of the reflected x-rays is 13 nm. Furthermore, the periodic length of the multi-layer film is varied at respective positions of the mirror such that the center wavelength of the reflected x-rays is 13 nm across the entire surface of the mirror. The structure and operation of the other elements of the LPX will be described next.

When the LPX system is operated for a considerable period of time, as was described in the foregoing description, high-velocity atoms, ions and electrons, which are emitted from the plasma 406, collide with the nozzle 404 and members surrounding the nozzle. The collision results in abrasion of the nozzle and the members surrounding the nozzle, and the substances removed from these elements are scattered into the surrounding areas. In particular, these scattered substances deposit or adhere to the multi-layer film parabolic mirror 407 and x-ray filter 409. As a result, these substances, which deposit on the mirror and the filter, absorb x-rays, and reduce the reflectivity of the mirror and the transmissivity of the filter. The present apparatus can remove the substances that adhere to the film and the mirror.

To remove undesired substances from the mirror and filter, the operation of the LPX is temporarily interrupted after operation for a fixed period of time. The LPX can also be temporarily interrupted if the quantity of x-rays through the x-ray filter, which is monitored by a device such as an x-ray quantity monitor, drops below a specified quantity of x-rays. After the LPX has been temporarily interrupted, the valve 416 is opened so that oxygen is allowed to flow into the vacuum vessel. The valve 416 and the valve 420 on the exhaust side are adjusted such that the pressure inside the vacuum vessel 400 is maintained at a desired pressure.

Next, an aluminum (Al) mirror is set in the position of 410a. Then, the excimer lamp 412 in the ultraviolet lamp chamber 411 is lit. The ultraviolet light emitted from the excimer lamp 412 is reflected by the mirror 413, passes through the window 414, and is then reflected by the Al mirror at the position of 410a such that this light illuminates the multi-layer film parabolic mirror 47. Ordinarily, the window 414 covered by the shutter 415 so that stray particles are not deposited on the window 414, and the shutter 415 is opened only during irradiation by the excimer lamp 412. Since the area around the multi-layer film mirror 407 is in an oxygen atmosphere, carbon deposited on the surface of the multi-layer parabolic mirror 407 is removed by the formation of carbon dioxide, as described in the foregoing description. As a result, the reflectivity of the multi-layer film parabolic mirror 407 is restored to its initial value. Moreover, the multi-layer film mirror 407 is heated by the heater 408, which is attached to the back surface of the multi-layer film mirror 407, for a faster removal of the carbon.

Similarly, carbon that deposits or adheres to the x-ray filter 409 can also be removed by moving the position of the Al mirror to the position indicated by the dotted line 410b. Thus, the transmissivity of the x-ray filter 409 can also be restored to its initial value.

In the present embodiment, the pressure is adjusted such that the attenuation of the required x-rays, which have a wavelength of 13 nm among the x-rays radiated from the plasma 406, and the attenuation of the ultraviolet light from the excimer lamp 412 is sufficiently small so that a sufficient quantity of ultraviolet light reaches the multi-layer film parabolic mirror 407 or x-ray filter 409. Moreover, the pressure is such that a sufficient quantity of oxygen molecules or ozone molecules generated from oxygen by the ultraviolet light is present in the vicinity of the surfaces of these elements to cause a reaction with the carbon contained in the stray substances adhering to these elements. The pressure varies significantly depending on the length of the light path of the ultraviolet light and the required removal rate, for example. However, the pressure may range from approximately several hundredths of a torr to approximately several tens of torr.

Carbon is also deposited on the vacuum side of the laser light introduction window 403. In order to remove substances from the laser light introduction window 403, the Al mirror 417 is inserted as shown in FIG. 4. Then, to remove the carbon from the window, it is sufficient to light the excimer lamp 418 such that the light is reflected by the mirror 419 and the Al mirror 417 to illuminate the laser light introduction window 403. Since the light from the excimer lamp 418 may be absorbed by the oxygen contained in the atmosphere, it is possible to reduce the absorption if the space between the excimer lamp 418 and the laser light introduction window 403 is surrounded by a member, and the interior of this space is purged with nitrogen, or is evacuated to a vacuum.

In the present embodiment, it is necessary to interrupt the operation of the LPX temporarily in order to remove stray particles that have deposited or adhered to the optical elements. As a result, the operating efficiency of the apparatus decreases. However, the fifth embodiment, which will be described next by referring to FIG. 5, is devised so that the stay particles can be removed without interrupting the operation of the LPX.

Figure 5:
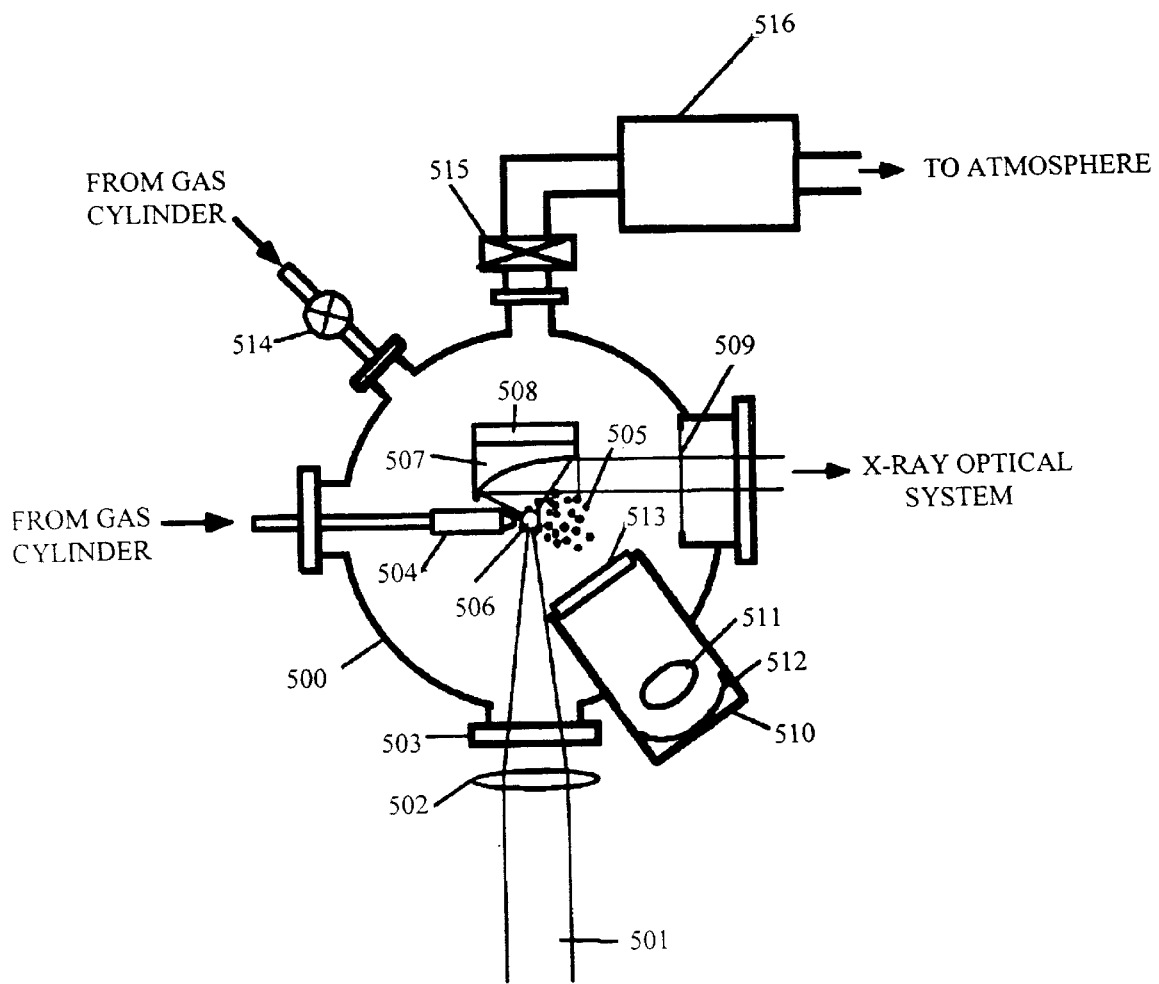
FIG. 5 is a schematic diagram illustrating an LPX system for use as an x-ray source in an x-ray apparatus in accordance with a fifth embodiment of the present invention.

FIG. 5 is a schematic diagram illustrating an LPX system for use as an x-ray source in an x-ray apparatus in accordance with a fifth embodiment of the present invention. This LPX system includes a vacuum vessel 500, a laser light 501, a focusing lens 502, a laser light introduction window 503, a nozzle 504, a cluster (gas) 505, plasma 506, a multi-layer film parabolic mirror 507, a heater 508, an x-ray-transmitting visible-light-cutting filter 509, an ultraviolet lamp chamber 510, an excimer lamp 511, a mirror 512, a window 513, valves 514 and 515, and a vacuum evacuation apparatus 516. The x-ray transmitting visible-light-cutting filter 509 is also known as an x-ray filter.

As in the other embodiments, the laser light 501 is focused on a gas or cluster-torm target material, which jets from the nozzle 504, for generation of plasma 506. The gas being used is Krypton (Kr). The x-rays radiated from the plasma 506 are reflected by the multi-layer film parabolic mirror 507. Then, the x-rays, which have a wavelength depending on the multi-layer film, pass through the x-ray filter 509, and are conducted into the x-ray optical system.

In the present embodiment, the tip end portion of the nozzle 504 and the parts surrounding this tip end portion are made of Kevlar, a type of organic compound. As a result, the stray substances that deposit or adhere to the multi-layer film parabolic mirror 507 consist of organic matter. The multi-layer film used in this embodiment consists of molybdenum (Mo) and silicon carbide (SiC), and the center wavelength of the reflected x-rays is 13 nm. A heater 508 is attached to the back surface of the multi-layer film parabolic mirror 507. Since this Mo and SiC multi-layer film has a higher heat resistance than the Mo and Si multi-layer film used in the fourth embodiment, heating to higher temperature is possible. The heating to a higher temperature is useful because such heating makes it possible to accelerate the reaction between carbon and a gas, such as oxygen or ozone. The x-ray filter 509 uses a molybdenum (Mo) film with a thickness of 0.3 $\mu$m, which is formed on the surface of a silicon (Si) thin film with a thickness of 0.5 $\mu$m.

When this LPX is operated, the excimer lamp 511 inside the ultraviolet lamp chamber 510 is lit. The light from the excimer lamp 511 is reflected by the mirror 512, and the surface of the multi-layer film parabolic mirror 507 is irradiated with ultraviolet light via the window 513. Oxygen gas flows into the vacuum vessel 500 from an oxygen cylinder via the valve 514, and is discharged by the vacuum pump 516 via the valve 515. The interior of the vacuum vessel 500 is adjusted to a desired pressure by adjusting the valves 514 and 515.

In the present embodiment, the pressure is such that the attenuation of the required x-rays, which have a wavelength of 13 nm among the x-rays radiated from the plasma 506, and the attenuation of the ultraviolet light from the excimer lamp 511 is sufficiently small so that a sufficient quantity of ultraviolet light reaches the multi-layer film parabolic mirror 507. Moreover, the pressure is adjusted such that a sufficient quantity of oxygen molecules or ozone molecules generated from oxygen by the ultraviolet light is present in the vicinity of the surfaces of the multi-layer film parabolic mirror 507 to cause a reaction with the organic matter on the surface of the multi-layer film parabolic mirror 507. This pressure also varies significantly according to the lengths of the light paths of the x-rays and ultraviolet light, and the required removal rate, for example. However, the pressure may range from approximately several hundredths of a torr to approximately several tens of torr.

If an LPX constitutes the devices such as those shown in FIG. 5, irradiation with ultraviolet light can be continued without any screening of the x-rays or laser light. Accordingly, carbon on the optical elements can be removed even during the operation of the LPX resulting in the improvement of the operating efficiency of the LPX. Furthermore, in the present embodiment, only a method for removing deposited matter from the multi-layer film parabolic mirror 507 was indicated. However, the removal of carbon-type deposited matter from the x-ray filter 509 and the laser light introduction window 503 could also be accomplished by a similar method.

Figure 6:
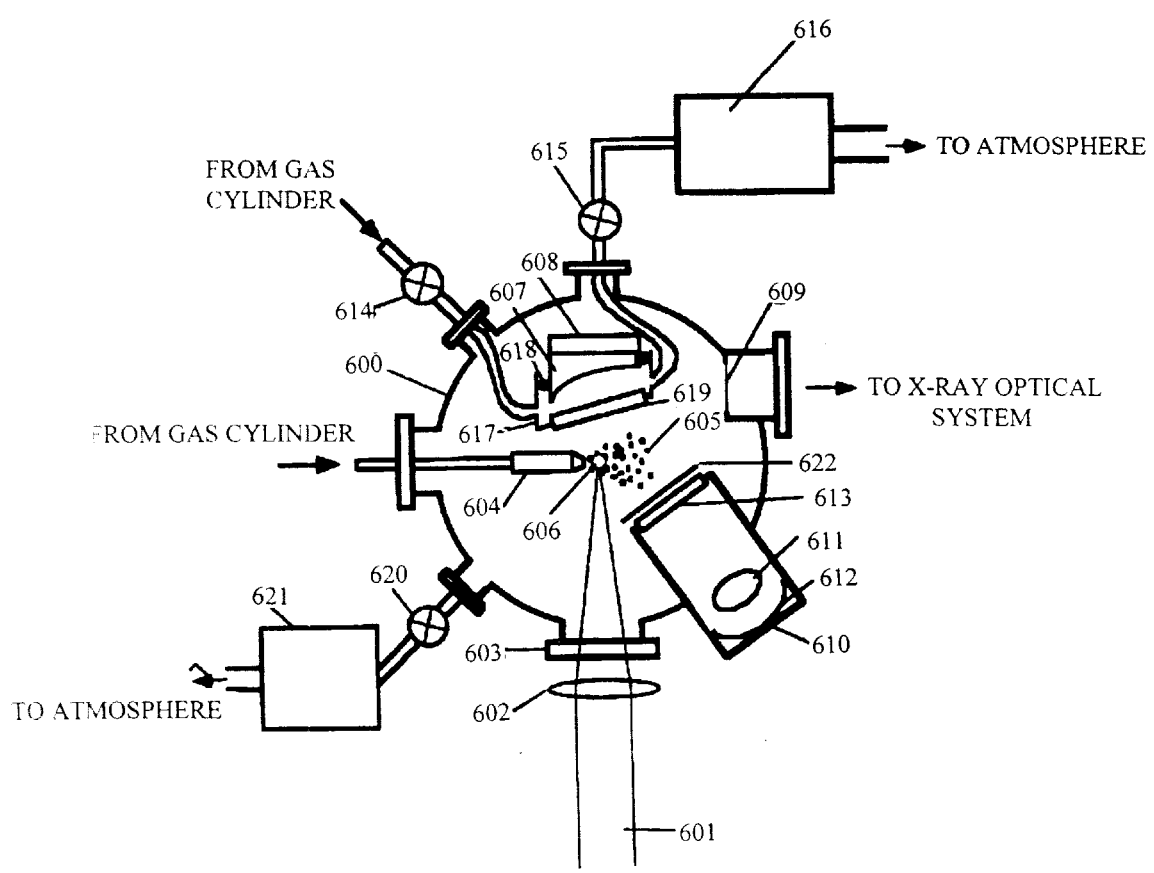
FIG. 6 is a schematic diagram illustrating an LPX system for use as an x-ray source in an x-ray apparatus in accordance with a sixth embodiment of the present invention.

FIG. 6 is a schematic diagram illustrating an LPX system for use as an x-ray source in an x-ray apparatus in accordance with a sixth embodiment of the present invention. This LPX system includes a vacuum vessel 600, a laser light 601, a focusing lens 602, a laser light introduction window 603, a nozzle 604, a cluster (gas) 605, plasma 606, a multi-layer film parabolic mirror 607, a heater 608, an x-ray-transmitting visible-light-cutting filter 609, an ultraviolet lamp chamber 610, an excimer lamp 611, a mirror 612, windows 613 and 619, valves 614, 615, and 620, vacuum evacuation apparatus 616, vacuum evacuation apparatus 621, a cover 617, an O-ring 618, and a shutter 622. The x-ray transmitting visible-light-cutting filter 609 is also known as an x-ray filter.

Since most of the LPX shown in FIG. 6 is similar to the fourth and fifth embodiments, only different parts will be described in detail. The center wavelength of the reflected x-rays from the multi-layer parabolic mirror 607, which consists of Mo and Si, is 13 nm. If it is detected that the reflectivity of the multi-layer film parabolic mirror 607 has dropped following LPX operation, the operation of the LPX is temporarily suspended, and the area around the multi-layer film parabolic mirror 607 is covered by the cover 617. Then, an O-ring 618 is inserted between the cover 617 and the multi-layer film parabolic mirror 607 forming a structure that seals the reflective surface of the multi-layer film parabolic mirror 607.

After the cover 617 has been attached to the multi-layer film parabolic mirror 607, the valve 614 is opened so that oxygen gas is allowed to flow into the area inside the cover. The valve 615 is also opened so that the area inside the cover 617 is evacuated by the vacuum evacuation apparatus 616. The valves 614 and 615 are adjusted so that the pressure inside the cover 617 is maintained at a desired value.

Next, the shutter 622 is opened, and the excimer lamp 611 inside the ultraviolet light chamber 610 is lit. The ultraviolet light from the excimer lamp 611 reflects from the mirror 612, passes through the windows 613 and 619, and illuminates the multi-layer film parabolic mirror 607. As a result, carbon-type substances adhering or depositing to the surfaces of the multi-layer film parabolic mirror 607 can be removed as described in the foregoing description.

In the present embodiment, oxygen gas is supplied only to the area inside the cover 617, which has a sealed structure. Accordingly, there is no leakage of oxygen gas into the vacuum vessel 600. Thus, the ultraviolet light from the excimer lamp 611 is not absorbed by oxygen, and more intense ultraviolet light reaches the multi-layer film parabolic mirror 607. Furthermore, since there is no absorption of ultraviolet light by oxygen inside the vacuum vessel 600, the pressure inside the cover 617 can be increased compared to the pressure in the fourth and fifth embodiments. As a result of the increased pressure, the carbon-type substances adhering or depositing to the multi-layer film parabolic mirror 607 can be removed in less time.

Moreover, the structure of the cover 617 is not limited to a sealed structure. This structure may also be only substantially sealed. Even if there is a slight gap between the cover 617 and the multi-layer film parabolic mirror 607, oxygen leaking into the vacuum vessel 600 is discharged by the vacuum evacuation apparatus 621 as long as the conductance is sufficiently small. As a result, the partial pressure of oxygen inside the vacuum vessel 600 is not increased. So, the absorption of ultraviolet light by this oxygen is extremely small, and can be kept at a level that causes no practical problems.

Furthermore, in the present embodiment, the multi-layer film mirror 607 consists of Mo and Si, and the tip end of the nozzle 604 and the members surrounding the nozzle are made of SiC. When the nozzle and surrounding members are abraded away by the plasma, Si and C deposit on the surface of the multi-layer film parabolic mirror 607. The absorption end of Si is 12.4 nm. Moreover, since Si has a high transmissivity with respect to x-rays having a wavelength of 13 nm, there is no great drop in reflectivity even if a certain amount of Si deposits or adheres to the surface of the multi-layer film parabolic mirror 607. Meanwhile, since carbon can be removed by the method described above, there is not a big decrease in reflectivity even if the LPX is operated for a long period of time.

In the present embodiment, only a method for removing deposited matter from the multi-layer film parabolic mirror 607 was described. However, it would also be possible to remove carbon-type deposited matter from the x-ray filter 609 or the laser light introduction window 603 by a similar method.

Moreover, the thickness of the uppermost layer of the multi-layer film mirror may be made sufficiently thinner than the Si film thickness of the other layers. As a result of this reduction in thickness, the reflectivity will rise gradually as stray particles of Si are deposited until a thickness corresponding to the length of the period of the multi-layer film is reached. Then, when a thickness corresponding to the length of the period of the multi-layer film is reached, the reflectivity will gradually decrease. Accordingly, the drop in reflectivity can be inhibited for a longer period of time than it can in cases where Si is formed in the uppermost layer at the ordinary thickness corresponding to the length of the period. If the other substance making up the multi-layer film is not susceptible to the effects of oxidation, for example, then, the Si of the uppermost layer may be eliminated. Moreover, this is not limited to the case of Mo and Si multi-layer films. As long as the stray particles that adhere to the multi-layer film mirror consist of one of the substances making up the multi-layer film, a similar effect can be obtained if a substance, which is different from the substance uses as the stray particles, is used in the uppermost layer of the multi-layer film, or by forming this layer with the minimum required thickness.

The present invention is not limited as to the materials for constructing the nozzle and members surrounding the nozzle that are listed in the foregoing description. For example, other embodiments of the present invention may use $SiO_2$, $ZrO_2$, or $Si_3N_4$ for the nozzle.

In the embodiments described above, oxygen was used as the gas that was caused to flow into the vacuum vessel or area inside the cover. However, it would also be possible to use ozone, a gas containing ozone or a gas containing oxygen, such as air. Furthermore, an excimer lamp was used as the ultraviolet light source. However, it would also be possible to use a mercury lamp or an excimer laser. Alternatively, since x-rays as well as ultraviolet light is radiated from a laser-produced plasma, it would also be possible to use such plasma as an ultraviolet light source. Moreover, if an LPX is used as the ultraviolet light source, there is no need to provide a separate ultraviolet light source. Accordingly, the construction of the apparatus can be greatly simplified. Furthermore, both the generation of x-rays and the removal of carbon-type deposited matter by the ultraviolet light can be simultaneously accomplished merely by generating plasma in an oxygen atmosphere, and as a result, there is no need to stop the operation of the LPX. Thus, such an arrangement is also preferred due to an increase in the operating efficiency.

Furthermore, a pulse jet nozzle was used as the nozzle in the present invention. However, it would also be possible to use a continuously jetting nozzle. In the embodiments described in the foregoing description, Kr gas was used as the target substance. However, it would also be possible to use some other substance, such as $CO_2$, $N_2$ or Xe.

While the invention has been described in detail and with reference to specific embodiments thereof, it will be apparent to one skilled in the art that various changes and modifications can be made therein without departing from the spirit or scope thereof. Thus, it is intended that the present invention covers the modifications and variations of this invention provided they come within the scope of the appended claims and their equivalents.

What is claimed is:

1. An x-ray apparatus, comprising:
    an x-ray source;
    an x-ray optical system, wherein the x-ray optical system extracts x-rays of a specific wavelength from the x-ray source and converts the x-rays into a beam; and
    an irradiation source that causes radiation to be incident on surfaces of optical elements contained in the x-ray apparatus and removes contaminants on the surfaces.

2. The x-ray apparatus according to claim 1, wherein the irradiation source is a pulse-form energy beam.

3. The x-ray apparatus according to claim 2, wherein the pulse-form energy beam has a pulse width of 1 microsecond or less.

4. The x-ray apparatus according to claim 3, wherein an energy density per unit area of the pulse-form energy beam is variable.

5. The x-ray apparatus according to claim 2, wherein an energy density per unit area of the pulse-form energy beam is variable.

6. The x-ray apparatus according to claim 1, wherein the irradiation source has a variable irradiation position such that entire surfaces of the optical elements can be irradiated.

7. The x-ray apparatus to claim 1, wherein the optical elements include reflective mirrors having a multi-layer film such that the multi-layer film has a number of layers greater than the number of layers required for sufficient reflectivity with the x-rays being used.

8. The x-ray apparatus according to claim 7, wherein the multi-layer film has an uppermost layer and a plurality of layers under the uppermost layer such that the uppermost layer is made of a substance that has a small x-ray absorption coefficient, and has a thickness greater than that of the one layer forming a periodic structure under the uppermost layer.

9. The x-ray apparatus according to claim 1, wherein a vacuum vessel contains the optical elements and wherein an inert gas is introduced into the vacuum vessel during irradiation by the irradiation source.

10. The x-ray apparatus according to claim 1, further comprising a screening device, wherein the screening device covers the surfaces of the optical elements that are not being irradiated by the irradiation source.

11. The x-ray apparatus according to claim 1, wherein a vacuum vessel contains the optical elements and wherein either oxygen or ozone, both oxygen and ozone, or a gas containing at least oxygen or ozone is introduced into the vacuum vessel during irradiation by the irradiation source.

12. The x-ray apparatus according to claim 1, further comprising a mechanism that supplies water to the surfaces of the optical elements during irradiation by the irradiation source.

13. The x-ray apparatus according to claim 1, wherein the irradiation source is a continuous ultraviolet light beam.

14. The x-ray apparatus according to claim 1, further comprising:
    a vessel for containing the optical elements, wherein the vessel can be sealed or substantially sealed;
    a screening plate having a transmitting window, wherein the screening plate seals the vessel during irradiation of the optical elements by the irradiation source and is moved to a side of the vessel during irradiation of the optical elements by the x-rays, the transmitting window allowing irradiation of the surfaces of the optical elements by the irradiation source when the vessel is sealed or substantially sealed; and
    a gas introduction mechanism, which introduces either oxygen or ozone, both oxygen and ozone, or a gas containing at least oxygen or ozone, into the vessel.

15. The x-ray apparatus according to claim 1, further comprising a heater for heating the optical elements during irradiation with the irradiation source.

16. The x-ray apparatus according to claim 1, wherein the irradiation source removes contaminants adhering to the surfaces of the optical elements without disassembling the x-ray apparatus.

17. The x-ray apparatus according to claim 1, wherein the optical elements include reflective mirrors have a multi-layer film, and the multi-layer film has an uppermost layer and a plurality of layers under the uppermost layer such that the uppermost layer is made of a substance that has a small x-ray absorption coefficient, and has a thickness greater than that of the one layer forming a periodic structure under the uppermost layer.

* * * * *